(12) United States Patent
Abou-Khalil et al.

(10) Patent No.: US 11,437,522 B2
(45) Date of Patent: Sep. 6, 2022

(54) FIELD-EFFECT TRANSISTORS WITH A POLYCRYSTALLINE BODY IN A SHALLOW TRENCH ISOLATION REGION

(71) Applicant: GLOBALFOUNDRIES U.S. Inc., Santa Clara, CA (US)

(72) Inventors: Michel J. Abou-Khalil, Essex Junction, VT (US); Steven M. Shank, Jericho, VT (US); Mark Levy, Williston, VT (US); Rajendran Krishnasamy, Essex Junction, VT (US); John J. Ellis-Monaghan, Grand Isle, VT (US); Anthony K. Stamper, Williston, VT (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 2 days.

(21) Appl. No.: 16/890,063

(22) Filed: Jun. 2, 2020

(65) Prior Publication Data
US 2021/0376159 A1    Dec. 2, 2021

(51) Int. Cl.
*H01L 29/786*    (2006.01)
*H01L 21/763*    (2006.01)
*H01L 29/06*    (2006.01)
*H01L 29/423*    (2006.01)

(52) U.S. Cl.
CPC ...... *H01L 29/78672* (2013.01); *H01L 21/763* (2013.01); *H01L 29/0642* (2013.01); *H01L 29/4236* (2013.01)

(58) Field of Classification Search
CPC ............. H01L 29/78672; H01L 21/763; H01L 29/0642; H01L 29/4236
See application file for complete search history.

(56) References Cited

U.S. PATENT DOCUMENTS 7,259,103 B2    8/2007    Kim
10,192,779 B1 *    1/2019    Shank ............... H01L 21/26533

OTHER PUBLICATIONS

Steven M. Shank et al., "Multi-Depth Regions of High Resistivity in a Semiconductor Substrate", filed Oct. 10, 2019 as U.S. Appl. No. 16/598,064.
Michel J. Abou-Khalil et al., "Semiconductor Structures Including Stacked Depleted and High Resistivity Regions", filed Aug. 28, 2019 as U.S. Appl. No. 16/553,737.
Steven M. Shank et al., "Bulk Substrates With a Self-Aligned Buried Polycrystalline Layer" filed Dec. 13, 2018 as U.S. Appl. No. 16/218,868.
Hu et al., "High-Frequency Performance of Trigate Poly-Si Thin-Film Transistors by Microwave Annealing" IEEE Electron Device Letters, vol. 36, No. 4, pp. 345-347, Apr. 2015.
Kim et al., "High-Frequency Modeling of Poly-Si Thin-Film Transistors for Low-Cost RF Applications", IEEE Transactions on Electron Devices, vol. 59, No. 9, pp. 2296-2301, Sep. 2012.

* cited by examiner

*Primary Examiner* — Edward Chin
(74) *Attorney, Agent, or Firm* — Thompson Hine LLP; Anthony Canale

(57) ABSTRACT

Structures for a field-effect transistor and methods of forming a structure for a field-effect transistor. A shallow trench isolation region is formed in a semiconductor substrate. A trench is formed in the shallow trench isolation region, and a body region is formed in the trench of the shallow trench isolation region. The body region is comprised of a polycrystalline semiconductor material.

14 Claims, 3 Drawing Sheets

FIELD-EFFECT TRANSISTORS WITH A POLYCRYSTALLINE BODY IN A SHALLOW TRENCH ISOLATION REGION

BACKGROUND

The present invention relates to semiconductor device fabrication and integrated circuits and, more specifically, to structures for a field-effect transistor and methods of forming a structure for a field-effect transistor.

Device structures, such as switch transistors for radiofrequency integrated circuits, are susceptible to high capacitance and body-to-body leakage when formed using a bulk semiconductor wafer. A measure that may be taken to reduce the susceptibilities is to provide the bulk semiconductor substrate with triple well isolation that surrounds an active device region containing the device structure. Another measure that may be taken to reduce the susceptibilities is to replace the bulk semiconductor substrate with a silicon-on-insulator substrate in which a top silicon layer furnishes an active device region and a buried insulator or buried oxide (BOX) layer is arranged between the active device region and the silicon beneath the buried insulator layer.

Although such measures have proven suitable for their intended purpose, improved structures for a field-effect transistor and methods of forming a structure for a field-effect transistor are needed.

SUMMARY

In an embodiment of the invention, a structure includes a semiconductor substrate and a shallow trench isolation region in the semiconductor substrate. The shallow trench isolation region includes a trench. The structure further includes a body region in the trench of the shallow trench isolation region. The body region is comprised of a polycrystalline semiconductor material.

In an embodiment of the invention, a method includes forming a shallow trench isolation region in a semiconductor substrate, forming a trench in the shallow trench isolation region, and forming a body region comprised of a polycrystalline semiconductor material in the trench of the shallow trench isolation region.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

FIG. 4A is a top view in which FIG. 4 is taken generally along line 4-4.

DETAILED DESCRIPTION

Figure 1:
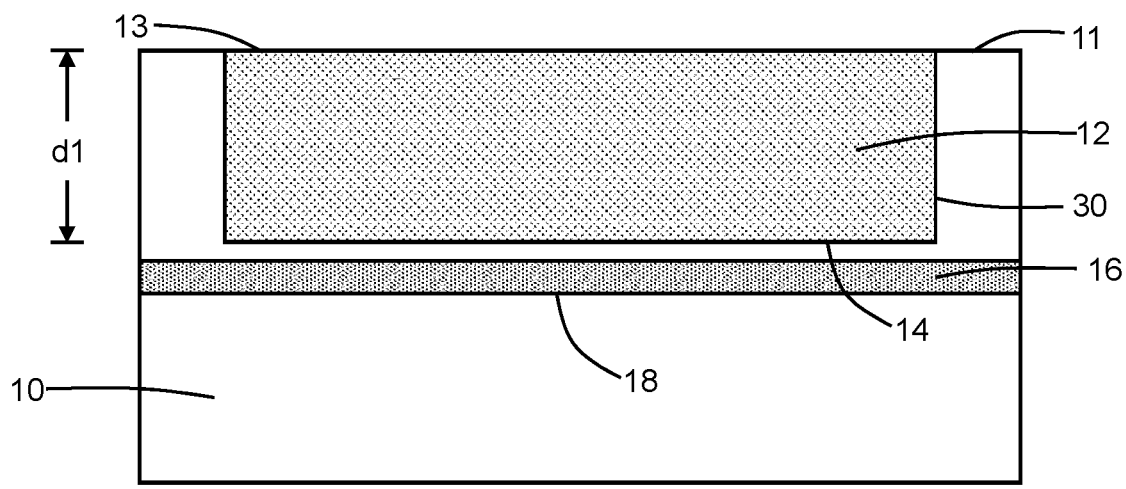
FIGS. 1-3 are cross-sectional views of a structure at successive fabrication stages of a processing method in accordance with embodiments of the invention.

With reference to FIG. 1 and in accordance with embodiments of the invention, a semiconductor substrate 10 is provided that contains a single-crystal semiconductor material, such as single-crystal silicon. The semiconductor substrate 10 may be a bulk substrate containing a single-crystal semiconductor material (e.g., single-crystal silicon). The semiconductor substrate 10 may be a high-resistivity bulk substrate containing silicon having an electrical resistivity greater than or equal to 100 ohm-cm. In an embodiment, the high-resistivity bulk substrate may have an electrical resistivity that is greater than or equal to 1000 ohm-cm. Alternatively, the semiconductor substrate 10 may be a low-resistivity bulk substrate containing silicon having an electrical resistivity less than 100 ohm-cm.

A shallow trench isolation region 12 is formed in the semiconductor substrate 10. The semiconductor substrate 10 is patterned with lithography and etching processes to form an isolation trench 30. To that end, a patterned hardmask may be formed on a top surface 11 of the semiconductor substrate 10 and an etching process, such as a reactive ion etching process, may be used to form the isolation trench 30. The isolation trench 30 may be subsequently filled with a deposited dielectric material, such as silicon dioxide, and planarized by employing, for example, chemical-mechanical polishing to form the shallow trench isolation region 12. The shallow trench isolation region 12 may have a top surface 13 that is either planar or substantially planar. The shallow trench isolation region 12 may extend from the top surface 13 through the semiconductor substrate 10 to a lower boundary 14 at an interface with the semiconductor substrate 10. The interface is located at a depth, d1, relative to the top surface 11 of the semiconductor substrate 10. The location of the interface with the semiconductor substrate 10 is established when the semiconductor substrate 10 is patterned to form the isolation trench 30.

A region 16 containing highly-disordered (e.g., amorphous) semiconductor material is formed by ion implantation in the semiconductor substrate 10. The ion implantation process performed to form the region 16 introduces energetic ions, as indicated diagrammatically by the single-headed arrows, with ion trajectories that travel in paths through the semiconductor substrate 10 and the shallow trench isolation region 12 into the semiconductor substrate 10. The energetic ions lose energy along their paths via stochastic scattering events with atomic nuclei and electrons in the traversed materials. Energy lost in nuclear collisions, which dominates at low energies, displaces target atoms of the semiconductor substrate 10 from their original lattice sites. The crystal lattice structure of the semiconductor substrate 10 is therefore damaged within the region 16 in comparison with the initial single-crystal state. The ions may eventually stop proximate to a lower boundary 18 of the region 16 after their kinetic energy is fully dissipated by energy loss. Region 16 of the semiconductor substrate 10 may be changed from crystalline semiconductor material (e.g., single-crystal silicon) to highly-disordered semiconductor material (e.g., amorphous silicon) due to the use of a high ion dose during implantation.

An ion implantation tool may be used to generate the ions from a suitable source gas and implant the ions into the semiconductor substrate 10 under given implantation conditions. The implantation conditions (e.g., ion species, dose, energy) may be selected to tune the characteristics of the region 16. In an embodiment, the ions may be generated from a noble atom gas, such as argon. The ion dose is selected to be less than a threshold ion dose beyond which recrystallization of the damaged semiconductor material in the region 16 by a subsequent anneal is not possible. For example, the ion dose may be within a range of $1 \times 10^{14}$ ions/cm² to 1.5×10¹⁵ ions/cm². The ion energy is chosen so that the lower boundary 18 of the region 16 is located, relative to the top surface 11 of the semiconductor substrate 10, below the lower boundary 14 of the shallow trench isolation region 12.

A portion of the semiconductor substrate 10 arranged beneath the lower boundary 18 of the region 16 may not be effected by the ion implantation as being located beyond the range of the implanted ions and may retain its single-crystal state. A portion of the semiconductor substrate 10 arranged between the top surface 11 and the region 16 may also contain single-crystal semiconductor material following the ion implantation.

Figure 2:
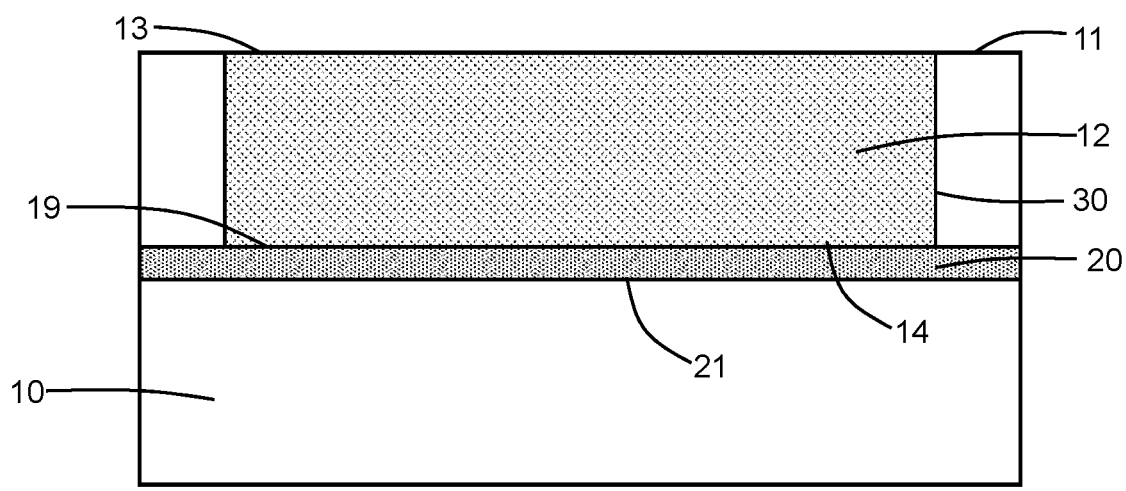

With reference to FIG. 2 in which like reference numerals refer to like features in FIG. 1 and at a subsequent fabrication stage of the processing method, the semiconductor substrate 10 is subjected to a thermal treatment (i.e., annealing process), which subjects the region 16 (FIG. 1) of the semiconductor substrate 10 to the thermal treatment. In an embodiment, the thermal treatment used to thermally treat the region 16 of the semiconductor substrate 10 may be a rapid thermal anneal. In an embodiment, the rapid thermal anneal may be performed using, for example, a bank of flash lamps that heat the semiconductor substrate 10 to a peak temperature in a range of 900° C. to 1125° C. with a dwell time at the peak temperature of 30 milliseconds to 60 seconds.

The thermal treatment recrystallizes a portion of the highly-disordered semiconductor material proximate to the lower boundary 18 of the region 16 into a polycrystalline layer 20 that contains polycrystalline semiconductor material (e.g., polysilicon). The polycrystalline layer 20 may be arranged substantially at or near the former location of the peak ion dose and/or peak damage in the semiconductor material of the semiconductor substrate 10. The polycrystalline semiconductor material of the polycrystalline layer 20 may also contain defects as residual damage in addition to the grains of the polycrystalline semiconductor material. The defects may also contain atoms of the inert gas species (e.g., argon) that was ion implanted to form the region 16.

The thermal treatment also recrystallizes the highly-disordered semiconductor material of the region 16 between the top surface 11 of the semiconductor substrate 10 and the polycrystalline layer 20 into single-crystal semiconductor material (e.g., single-crystal silicon). The single-crystal semiconductor material of the semiconductor substrate 10, which is arranged below and above the region 16, provides a crystalline template for recrystallization during the thermal treatment. The recrystallized single-crystal semiconductor material lacks grains and defects in contrast to the polycrystalline layer 20.

The polycrystalline layer 20, which may include only a single layer of polycrystalline semiconductor material, may be characterized as a trap-rich material that is capable of efficiently capturing charge carriers. In that regard, the polycrystalline layer 20 may have an electrical resistivity that is greater than or equal to the electrical resistivity of the remainder of the semiconductor substrate 10. In an embodiment, the polycrystalline layer 20 may have an electrical resistivity that is greater than or equal to 1,000 ohm-cm. In an embodiment, the electrical resistivity of the polycrystalline layer 20 may be within a range of 1,000 ohm-cm to 10,000 ohm-cm.

The polycrystalline layer 20 may extend laterally in the semiconductor substrate 10 beneath the lower boundary 14 of the shallow trench isolation region 12. More specifically, the polycrystalline layer 20 includes a portion positioned beneath the lower boundary 14 of the shallow trench isolation region 12 and adjacent portions that are positioned in the semiconductor substrate 10. The polycrystalline layer 20 includes a lower boundary 19 and an upper boundary 21 delimiting the depth profile for the polycrystalline semiconductor material. The single-crystal semiconductor material of the semiconductor substrate 10 is arranged beneath the lower boundary 19 of the polycrystalline layer 20 and above the upper boundary 21 of the polycrystalline layer 20. In the representative embodiment, the polycrystalline layer 20 is arranged fully below the shallow trench isolation region 12 and isolation trench 30. More specifically, the lower boundary 14 of the shallow trench isolation region 12 may be positioned in a vertical direction between the upper boundary 21 of the polycrystalline layer 20 and the top surface 13 of the shallow trench isolation region 12. The polycrystalline layer 20 may have a substantially uniform thickness as shown or, alternatively, a thickness that exhibits variations with position, such as a larger thickness where overlapping with the shallow trench isolation region 12. In embodiments, the polycrystalline layer 20 may be in direct contact with the shallow trench isolation region 12 at the lower boundary 14. In alternative embodiments, the polycrystalline layer 20 may overlap with the shallow trench isolation region 12 with the lower boundary 14 of the shallow trench isolation region 12 positioned in a vertical direction between the lower boundary 19 and the upper boundary 21 of the polycrystalline layer 20.

Figure 3:
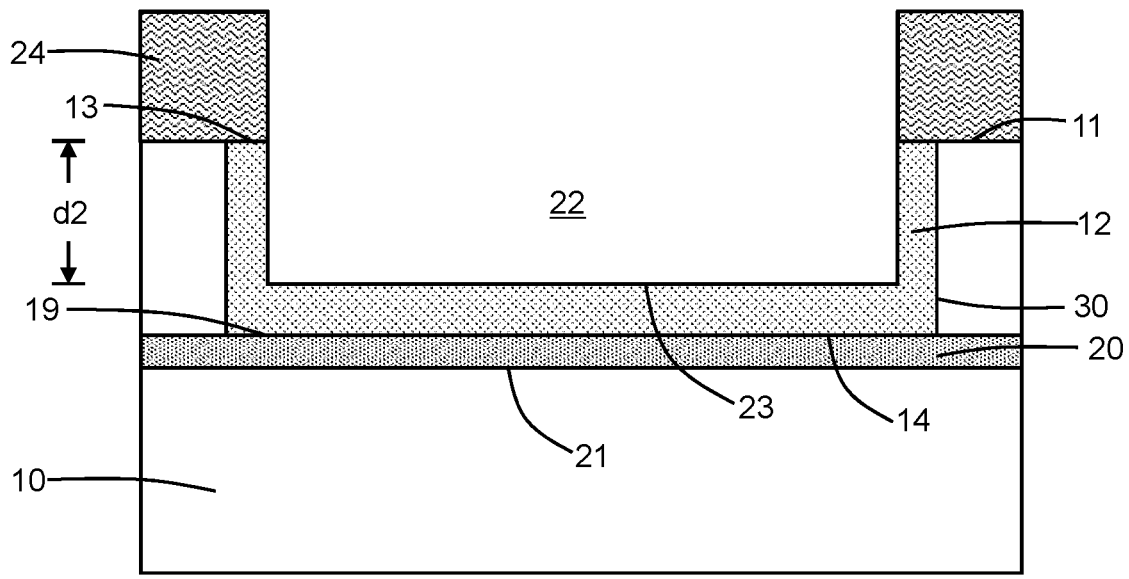

With reference to FIG. 3 in which like reference numerals refer to like features in FIG. 2 and at a subsequent fabrication stage of the processing method, a trench 22 is patterned in the shallow trench isolation region 12 with lithography and etching processes. To that end, an etch mask 24 is formed by a lithography process over the shallow trench isolation region 12. The etch mask 24 includes an opening located at the intended location for the trench 22. An etching process, such as reactive ion etching, is employed to etch and remove the dielectric material of the shallow trench isolation region 12 over an area of the opening in the etch mask 24.

The trench 22 penetrates partially through the shallow trench isolation region 12 such that a portion of the dielectric material of the shallow trench isolation region 12 is arranged as a lower margin between the bottom of the trench 22 and the lower boundary 14 of shallow trench isolation region 12. In that regard, the trench 22 has a lower boundary 23 at a depth, d2, that is between the lower boundary 14 of the shallow trench isolation region 12 and the top surface 11 of the semiconductor substrate 10. In that regard, the depth, d2, is less than the depth, d1 (FIG. 1) relative to the top surface 11 of the semiconductor substrate 10. The etching process forming the trench 22 may be controlled (e.g., timed) to avoid penetrating fully through the shallow trench isolation region 12 and thereby provide the lower margin. Portions of the shallow trench isolation region 12 also laterally encircle or surround the trench 22 to provide a lateral margin of dielectric material between side edges of the trench 22 and the semiconductor substrate 10.

Figure 4:
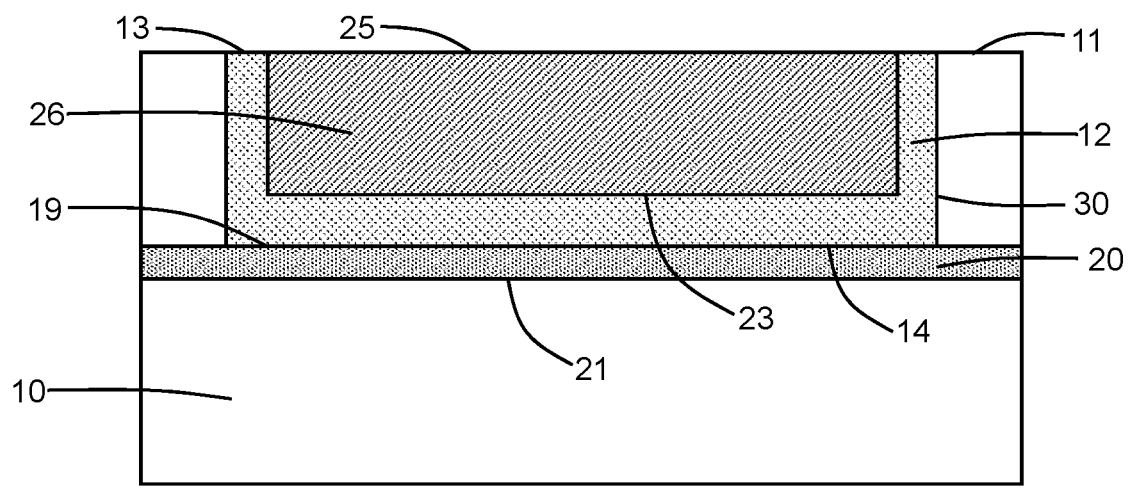
FIG. 4 is a cross-sectional view of the structure at a fabrication stage subsequent to FIG. 3.
Figure 4A:
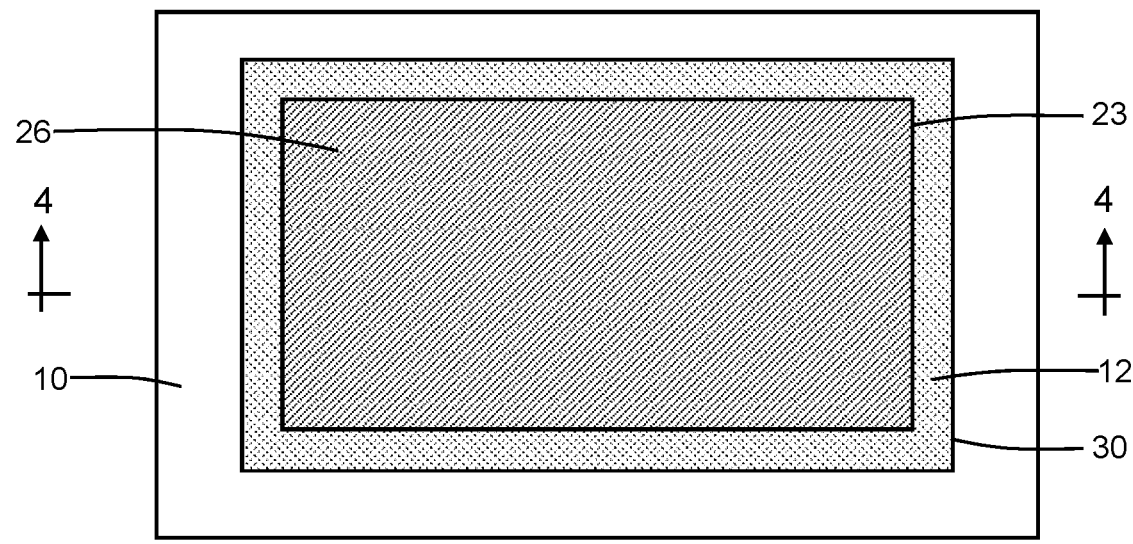

With reference to FIGS. 4, 4A in which like reference numerals refer to like features in FIG. 3 and at a subsequent fabrication stage of the processing method, a body region 26 is formed in the trench 22 and thereby embedded in the shallow trench isolation region 12. The body region 26 contains a polycrystalline semiconductor material, such as polycrystalline silicon (polysilicon). In an embodiment, the body region 26 may be formed by depositing a layer of the constituent polycrystalline semiconductor material with chemical vapor deposition and polishing the deposited layer with chemical-mechanical polishing. The body region 26 has a top surface 25 that may be coplanar or substantially coplanar with the top surface 13 of the shallow trench isolation region 12. The top surface 25 of the body region 26 may also be coplanar or substantially coplanar with the top surface 11 of the semiconductor substrate 10.

The body region 26 is fully separated from the polycrystalline layer 20 by a portion of the shallow trench isolation region 12. The polycrystalline layer 20 is positioned below the shallow trench isolation region 12 and the body region 26, and the dielectric material of this portion of the shallow trench isolation region 12 is positioned between the polycrystalline layer 20 and the body region 26. The body region 26 has a lower boundary that coincides with the lower boundary 23 of the trench 22 (FIG. 3) and that is spaced from the lower boundary 14 of the shallow trench isolation region 12 in a vertical direction toward the top surface 11 of the semiconductor substrate 10. Portions of the shallow trench isolation region 12 laterally surround the body region 26. These surrounding portions of the shallow trench isolation region 12 extend through the semiconductor substrate 10 to the portion of the shallow trench isolation region 12 between the polycrystalline layer 20 and the body region 26. The body region 26 is therefore arranged in a tub of dielectric material provided by different portions of the shallow trench isolation region 12 that surround the body region 26. The top surface 25 of the body region 26 is exposed for additional processing.

Figure 5:
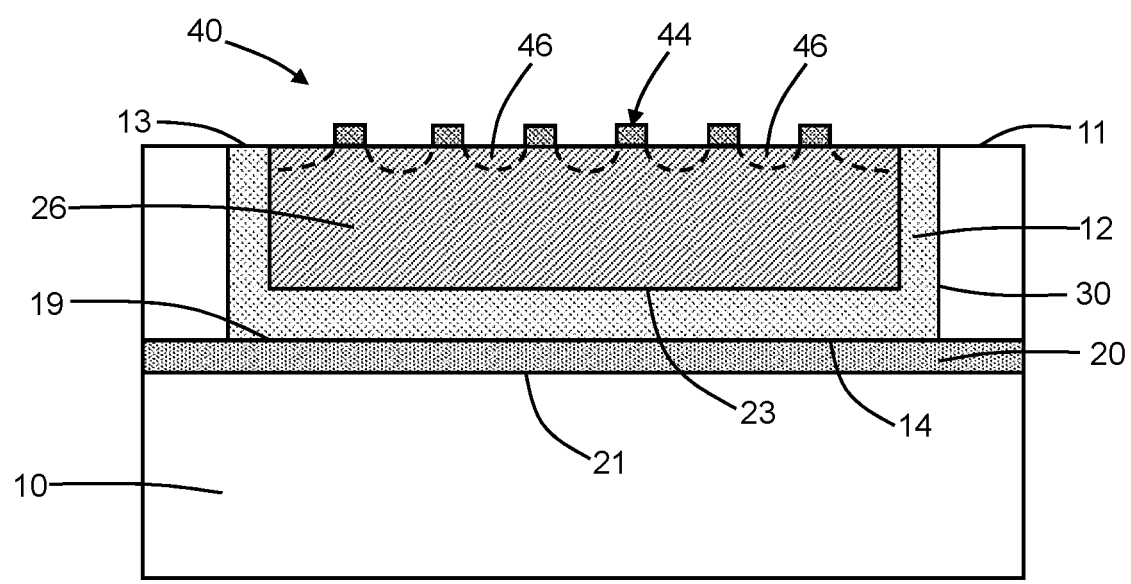
FIG. 5 is a cross-sectional view of the structure at a fabrication stage subsequent to FIG. 4.

With reference to FIG. 5 in which like reference numerals refer to like features in FIG. 4 and at a subsequent fabrication stage of the processing method, a switch field-effect transistor 40 may be fabricated by front-end-of-line processing as a device structure in the body region 26. The switch field-effect transistor 40 may include a gate 44 over the top surface 25 of the body region 26 and source/drain regions 46 that are formed in the body region 26. The gate 44 may include multiple fingers that may be formed, for example, by patterning a deposited layer of heavily-doped polysilicon, and the source/drain regions 46 may be formed by ion implantation or diffusion of, for example, an n-type dopant. The switch field-effect transistor 40 may include other elements, such as a gate dielectric between the fingers of the gate 44 and the body region 26, halo regions, and extension regions. In an embodiment, the switch field-effect transistor 40 may be deployed in a radio-frequency integrated circuit.

Middle-of-line processing and back-end-of-line processing follow, which includes formation of contacts, vias, and wiring for an interconnect structure that is coupled to the switch field-effect transistor 40.

The semiconductor substrate 10 may function as a back gate to which a bias may be applied to provide either a partially-depleted body region 26 or a fully-depleted body region 26. A different type of device structure, such as a stacked n-type field-effect transistor/p-type field effect transistor combination, may be formed using the body region 26 instead of the switch field-effect transistor 40.

The switch field-effect transistor 40 is formed using a body region 26 that contains polycrystalline semiconductor, instead of being formed in the single-crystal semiconductor material of the semiconductor substrate 10. The body region 26 of polycrystalline semiconductor material and the portions of the shallow trench isolation region 12 surrounding the body region 26 may, in combination, provide low harmonic distortion at small channel lengths for the switch field-effect transistor 40. The polycrystalline layer 20 may also contribute to a further reduction in harmonic distortion.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a semiconductor substrate including a first trench;
   a shallow trench isolation region comprising a dielectric material in the first trench in the semiconductor substrate, the shallow trench isolation region including a second trench fully surrounded by the dielectric material;
   a polycrystalline semiconductor region in the second trench of the shallow trench isolation region, the polycrystalline semiconductor region fully separated from the semiconductor substrate by the dielectric material of the shallow trench isolation region; and a field-effect transistor including a gate over the polycrystalline semiconductor region and a source/drain region in the polycrystalline semiconductor region.

2. The structure of claim 1 wherein the polycrystalline semiconductor region comprises polysilicon, and the semiconductor substrate comprises single-crystal silicon.

3. The structure of claim 1 wherein the second trench penetrates partially through the dielectric material of the shallow trench isolation region to a lower boundary, and the shallow trench isolation region includes a first portion that is arranged as a margin of the dielectric material between the polycrystalline semiconductor region at the lower boundary of the second trench and the semiconductor substrate adjacent to the lower boundary of the second trench.

4. The structure of claim 3 wherein the shallow trench isolation region includes a plurality of second portions that laterally surround the second trench and the polycrystalline semiconductor region.

5. The structure of claim 4 wherein the semiconductor substrate includes a top surface, and the plurality of second portions of the shallow trench isolation region extend from the top surface of the semiconductor substrate to the first portion of the shallow trench isolation region.

6. The structure of claim 1 wherein the shallow trench isolation region has a top surface, and the polycrystalline semiconductor region has a top surface that is substantially coplanar with the top surface of the shallow trench isolation region.

7. The structure of claim 1 further comprising:

a polycrystalline layer in the semiconductor substrate, the polycrystalline layer arranged beneath the shallow trench isolation region and the polycrystalline semiconductor region.

8. The structure of claim 7 wherein the polycrystalline layer includes a portion that directly contacts the shallow trench isolation region, and the dielectric material of the shallow trench isolation region separates the polycrystalline semiconductor region from the polycrystalline layer.

9. The structure of claim 1 wherein the semiconductor substrate is a bulk substrate.

10. The structure of claim 1 wherein the semiconductor substrate includes a top surface, the first trench has a lower boundary located at a first depth relative to the top surface of the semiconductor substrate, the lower boundary of the second trench is located at a second depth relative to the top surface of the semiconductor substrate, and the second depth is less than the first depth.

11. The structure of claim 1 wherein the dielectric material is silicon dioxide.

12. The structure of claim 1 wherein the shallow trench isolation region includes a margin of the dielectric material between the polycrystalline semiconductor region and the semiconductor substrate.

13. The structure of claim 1 wherein the shallow trench isolation region includes a margin of the dielectric material between the second trench and the semiconductor substrate.

14. The structure of claim 13 wherein the dielectric material is silicon dioxide.

* * * * *